United States Patent
Imayama et al.

(10) Patent No.: US 6,806,769 B2
(45) Date of Patent: Oct. 19, 2004

(54) DIFFERENTIAL AMPLIFIER

(75) Inventors: Teruo Imayama, Kanagawa (JP); Tsuneo Suzuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/318,095

(22) Filed: Dec. 13, 2002

(65) Prior Publication Data
US 2003/0112070 A1 Jun. 19, 2003

(30) Foreign Application Priority Data
Dec. 13, 2001 (JP) ........................... 2001-379708

(51) Int. Cl.[7] ................. H03F 3/45; H03F 3/04
(52) U.S. Cl. ........................... 330/252; 330/311
(58) Field of Search .................. 330/252, 311

(56) References Cited

U.S. PATENT DOCUMENTS

| 4,545,076 | A | * | 10/1985 | Biard et al. | ............... 398/208 |
| 4,994,756 | A | * | 2/1991 | Brilka | ............... 330/260 |
| 5,343,163 | A | | 8/1994 | Linder et al. | |
| 5,589,791 | A | | 12/1996 | Gilbert | |
| 6,188,280 | B1 | * | 2/2001 | Filip | ............... 330/252 |
| 6,198,359 | B1 | * | 3/2001 | Wichern | ............... 331/117 R |

* cited by examiner

Primary Examiner—Patricia Nguyen
(74) Attorney, Agent, or Firm—Oblon, Spivak, McClelland, Maier & Neustadt, P.C.

(57) ABSTRACT

A differential amplifier comprises an emitter follower, a differential amplifying circuit connected in a succeeding stage to the emitter follower, and a load circuit to compensate distortion of the differential amplifying circuit.

9 Claims, 10 Drawing Sheets

DIFFERENTIAL AMPLIFIER

CROSS REFERENCE TO RELATED APPLICATION

This application is based upon and claims the benefit of priority from the prior Japanese Patent Application No. 2001-379708, filed on Dec. 13, 2001; the entire contents of which are incorporated herein by reference.

BACKGROUND OF THE INVENTION

The present invention relates to a differential amplifier that is used for wireless communication terminals.

Various methods for reducing distortion of a differential amplifier have been devised, including those employing negative feedback and active devices, but all of the methods are not suitable for a differential amplifier that handles high frequency signals because of their respective restrictions upon phase compensation capacitance and input/output characteristics. Hence, such a differential amplifier handling high frequency signal is usually designed as disclosed in FIG. 10.

Figure 10:
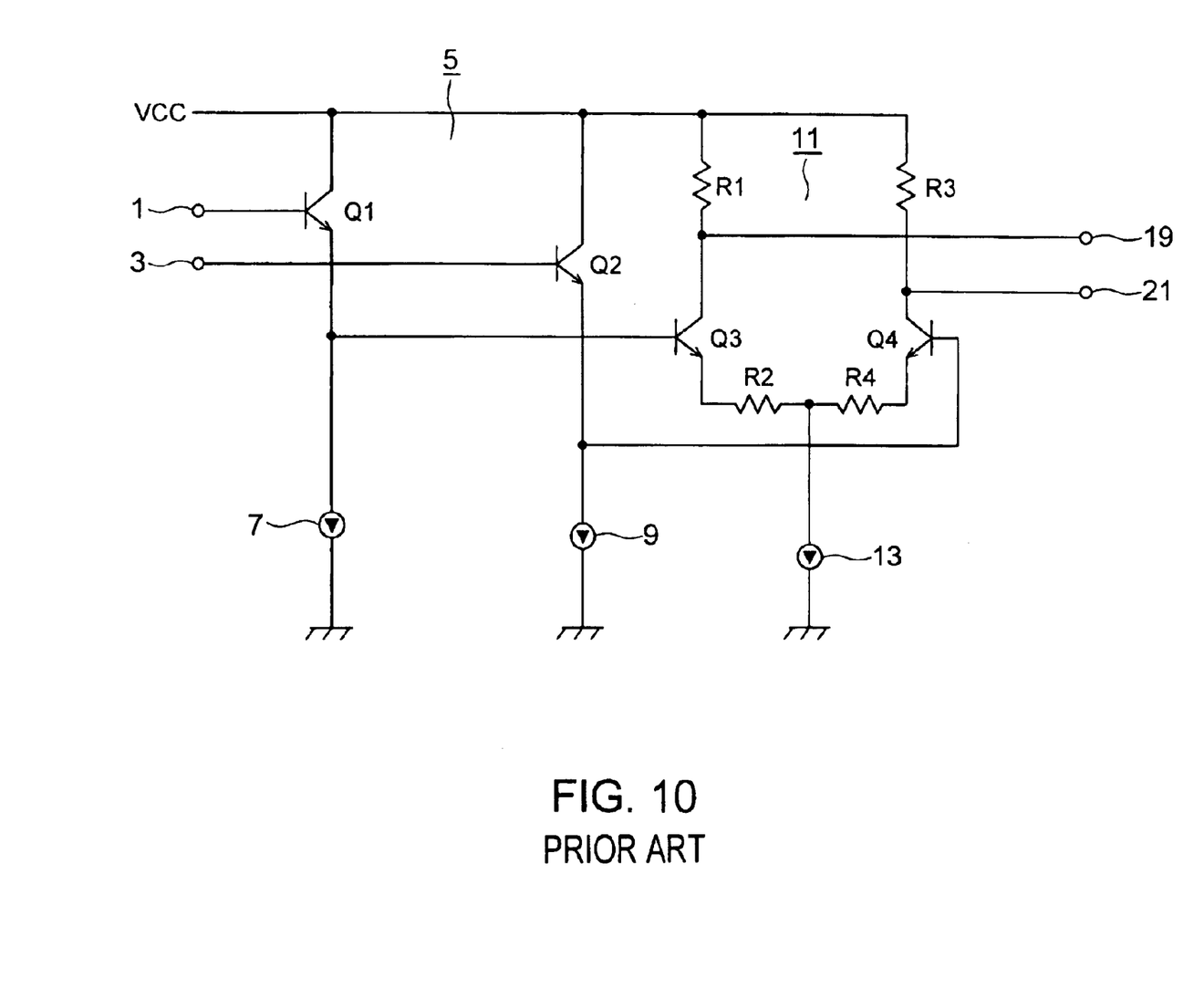
FIG. 10 is a circuit diagram showing a conventional differential amplifier dealing high frequency signal.

As can be seen in FIG. 10, an emitter follower 5 is comprised of NPN transistors Q1 and Q2 and current sources 7 and 9. Also, a differential amplifying circuit 11 consists of NPN transistors Q3 and Q4 in a differential pair, resistances R1, R2, R3 and R4, and a current source 13. The emitter follower 5 and the differential amplifying circuit 11 form a differential amplifier.

Signals applied respectively to bases of the transistors Q1 and Q2 are, after being buffered in these transistors, applied to bases of the transistors Q3 and Q4 and then converted, due to mutual conductance between the differential transistors Q3 and Q4 in a pair, from voltage to current, and thus, the signals are amplified.

When differential input signals applied to input terminals 1 and 3 are 2-tone signals (i.e., signals different in frequency but the same in level), output current from the differential amplifying circuit 11 exhibits IM3 (third order intermodulation) distortion.

The most simplified way of reducing such distortion in the state of the art of circuit technologies is enhancing current that flows in the transistors Q3 an Q4 in the differential amplifying circuit 11.

In this way, however, in order to raise or enhance third order output intercept points (OIP3 located at output terminals 19 and 21) by 6 dB which may be treated as indices of the distortion, the current applied to the differential amplifying circuit 11 must be approximately doubled, and this is not desirable in view of demand to lower power consumption.

BRIEF SUMMARY OF THE INVENTION

A differential amplifier according to an embodiment of the present invention comprises an emitter follower, a differential amplifying circuit connected in a succeeding stage to the emitter follower, and a load circuit to compensate distortion of the differential amplifying circuit.

DETAILED DESCRIPTION OF THE INVENTION

<Embodiment 1>

Figure 1:
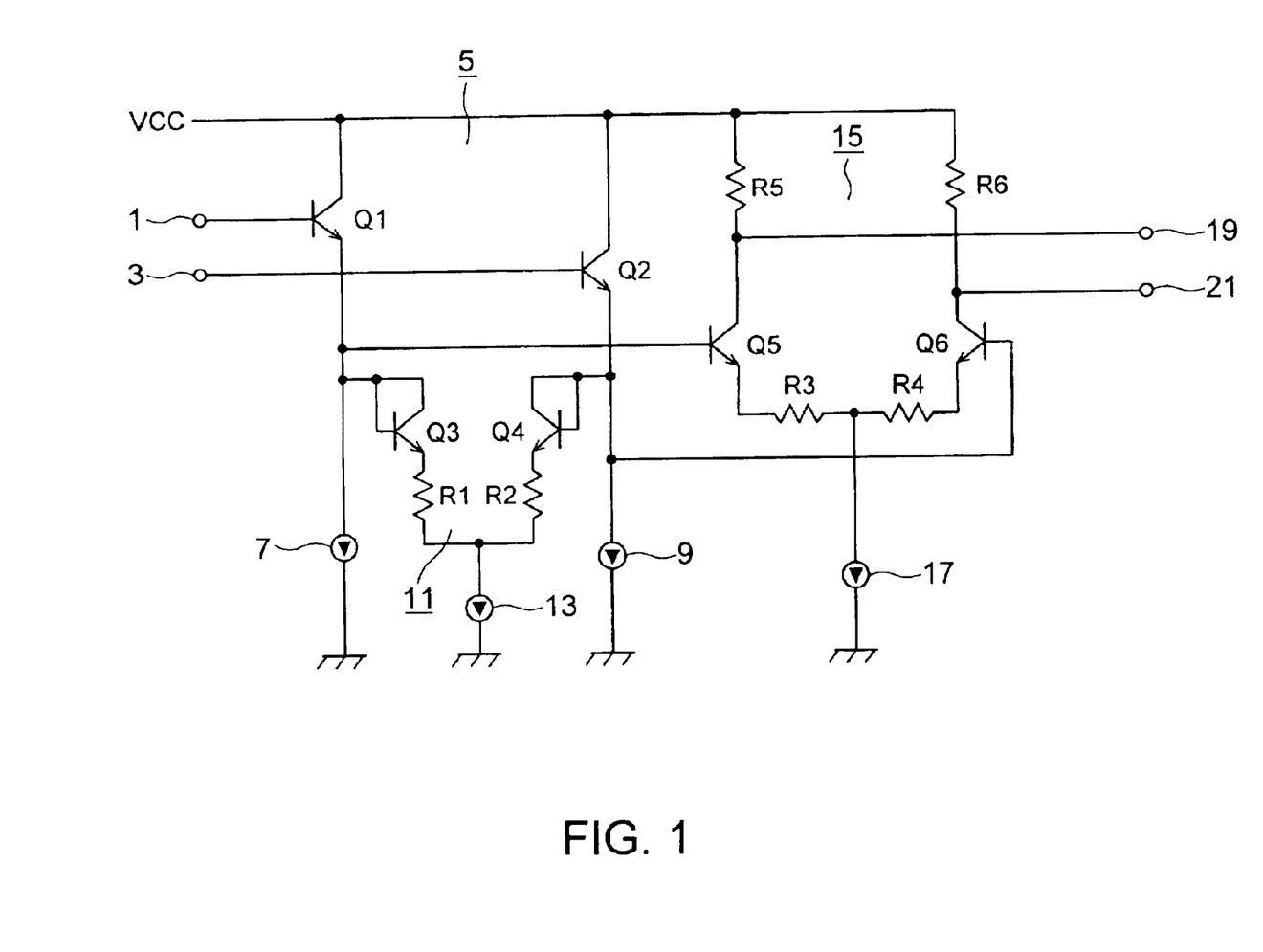
FIG. 1 depicts a basic circuit of a first embodiment of a differential amplifier according to an embodiment of the present invention.

FIG. 1 is a basic circuit diagram of a first embodiment of a differential amplifier according to the present invention.

As can be seen in FIG. 1, a first emitter follower 5 is comprised of NPN transistors Q1 and Q2 and current sources 7 and 9.

Mutual connections of these components are as follows: The transistor Q1 has its collector connected to voltage supply VCC, its base connected to an input terminal 1, and its emitter connected to one end of the current source 7 the other end of which is grounded. The transistor Q2 has its collector connected to voltage supply VCC, its base connected to an input terminal 3, and its emitter connected to one end of the current source 9, respectively. The other end of the current source 9 is grounded.

In FIG. 1, a differential amplifying circuit 15 consists of NPN transistors Q5 and Q6, resistances R3, R4, R5, and R6, and a current source 17.

These components are mutually connected in the following manner: The transistor Q5 has its collector connected to one end of the resistance R5, its base connected to an emitter of the transistor Q1, and its emitter connected to one end of the resistance R3, respectively. The other end of the resistance R5 is connected to the voltage supply VCC while the other end of the resistance R3 is connected to one end or first end of the current source 17. The other or second end of the current source 17 is grounded.

Also, the transistor Q6 has its collector connected to one end of the resistance R6, its base connected to an emitter of the transistor Q2, and its emitter connected to one end of the resistance R4, respectively. The other end of the resistance R6 is connected to the voltage supply VCC while the other end of the resistance R4 is connected to the first end of the current source 17. The other or second end of the current source 17 is grounded.

Further referring to FIG. 1, a load circuit 11 includes diode constituting NPN transistors Q3 and Q4, resistances R1 and R2, and a current source 13.

These components are mutually connected as follows: The transistor Q3 has its collector and base commonly connected to the emitter of the transistor Q1, and its emitter connected to one end of the resistance R1, respectively. The other end of the resistance R1 is connected to one end or first end of the current source 13. The other or second end of the current source 13 is grounded. The transistor Q4 has its collector and base connected to the emitter of the transistor Q2 in common, and its emitter connected to one end of the resistance R2. The other end of the resistance R2 is connected to the first end of the current source 13.

Assuming now that the first emitter follower 5 with the load circuit 11 and the differential amplifying circuit 15 respectively consume power up to the same extent, input impedance of the differential amplifying circuit 15 reaches higher, compared with that of the first emitter follower 5 with the load circuit 11, and hence, the differential amplifying circuit 15 does not turn out to be a load of the first emitter follower 5 with the load circuit 11.

Figure 2:
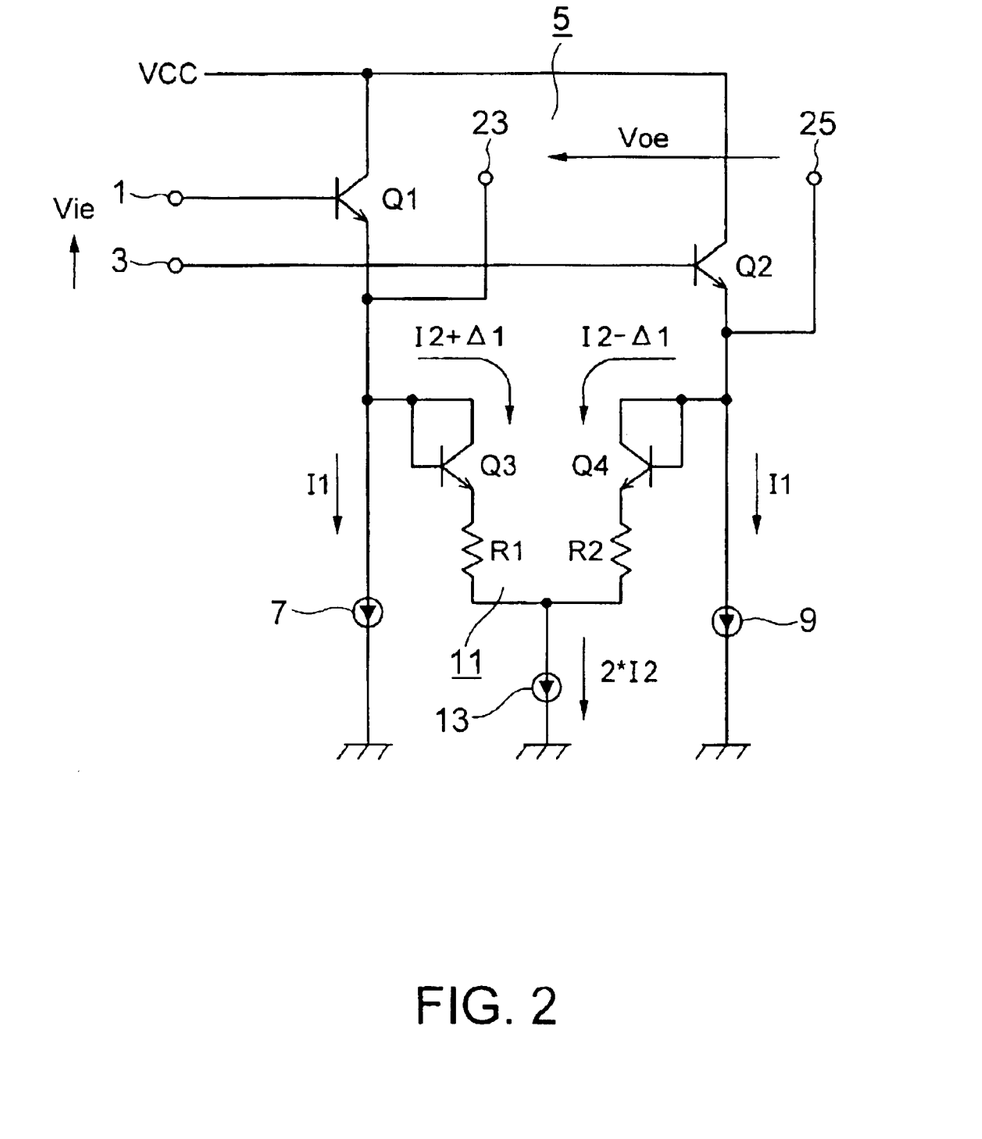
FIG. 2 is a circuit diagram showing a first exemplary emitter follower (5) along with a load circuit (11) in FIG. 1.
Figure 3:
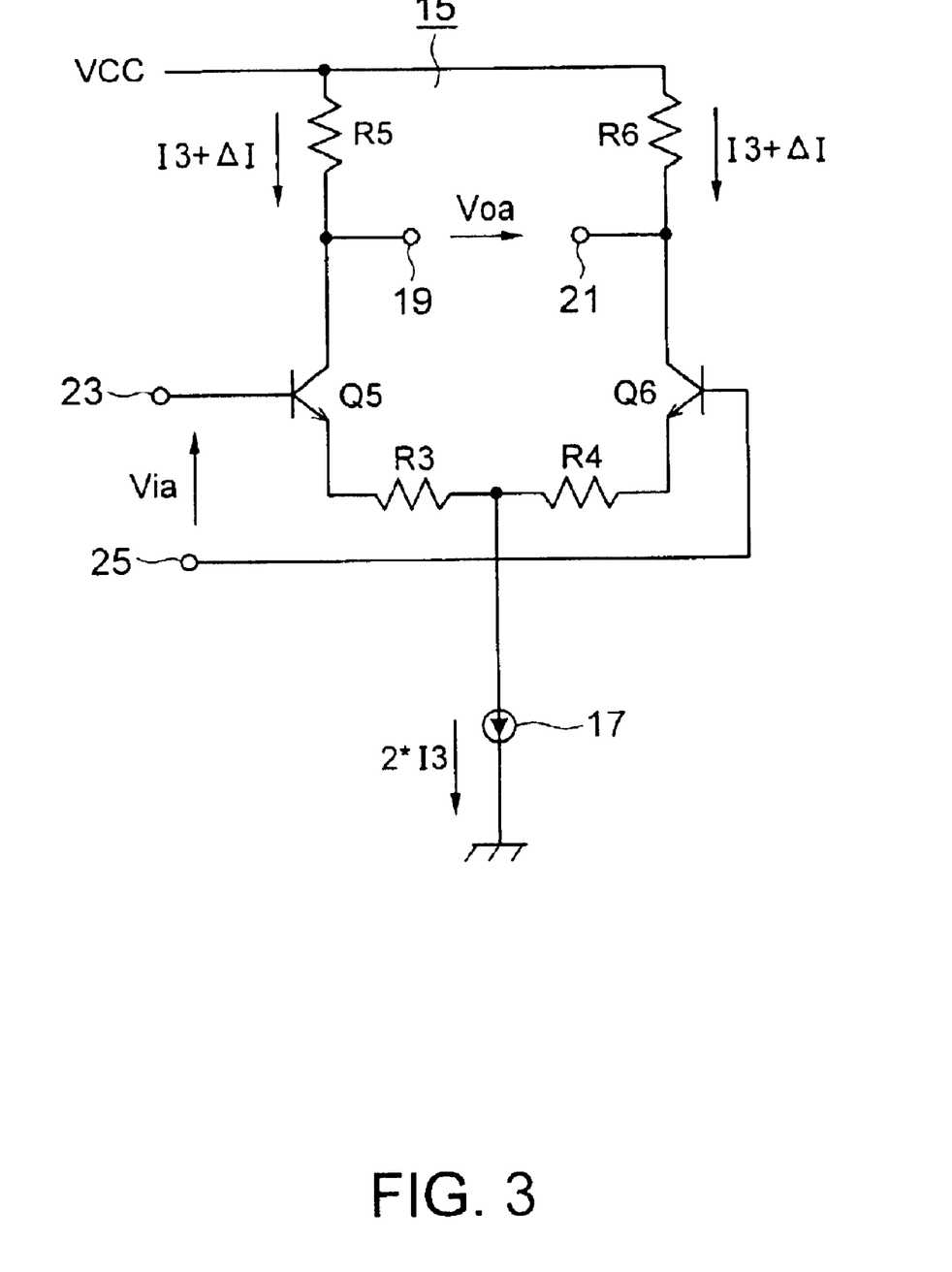
FIG. 3 is a circuit diagram showing a differential amplifying circuit (15) in FIG. 1.

In such a case, it may be convenient to recognize operation of the first emitter follower 5 with the load circuit 11 separate from that of the differential amplifying circuit 15; that is, their features can be taken for two separate circuitry blocks in the differential amplifier. FIG. 2 is a circuit diagram showing the first emitter follower 5 with the load circuit 11 while FIG. 3 is a circuit diagram of the differential amplifying circuit 15.

First, referring to FIG. 2, gain Gve will be obtained on the first emitter follower 5 with the load circuit 11.

Since the first emitter follower 5 with the load circuit 11 is configured symmetrically in the circuit in FIG. 2, simply contemplated should be voltage variations due to differential input signals applied to the input terminals 1 an 3, respectively.

The differential input signals applied to the bases of the transistors Q1 and Q2 are denoted by Vie, differential output signals produced from the emitters of the transistors Q1 and Q2 are represented by Voe, currents flowing in the current sources 7 and 9 are designated by I1, and current flowing in the current source 13 is represented by 2×I2, respectively.

A coefficient of current amplification β is regarded herein as being infinite. If the currents I2 are respectively varied by ΔI due to the differential input signals Vie, following equations can be used to express voltages ΔVbe1, ΔVbe2, ΔVbe3, and ΔVbe4 developed between the bases and emitters of the transistors Q1, Q2, Q3, and Q4, and voltages ΔVr1 and ΔVr2 developed at the resistances R1 and R2 (having resistance values R1 and R2), respectively:

$$\Delta Vbe1 = VT * \ln(I1 + I2 + \Delta I) \quad (1)$$

$$\Delta Vbe2 = VT * \ln(I1 + I2 - \Delta I) \quad (2)$$

$$\Delta Vbe3 = VT * \ln(I2 + \Delta I) \quad (3)$$

$$\Delta Vbe4 = VT * \ln(I2 - \Delta I) \quad (4)$$

$$\Delta Vr1 = (I2 + \Delta I) * R1 \quad (5)$$

$$\Delta Vr2 = (I2 - \Delta I) * R2 \quad (6)$$

where VT can be expressed in VT=kT/q, k is a Boltzmman constant, T is an absolute temperature, and q is an amount of electric charge.

The differential output signals Voe are obtained by using the equations (3), (4), (5) and (6), as follows:

$$\begin{aligned} Voe &= \Delta Vbe3 + \Delta Vr1 - (\Delta Vbe4 + \Delta Vr2) \\ &= VT \cdot \ln(I2 + \Delta I) + (I2 + \Delta I) * R1 - VT \cdot \ln(I2 - \Delta I) - \\ &\quad (I2 - \Delta I) * R2 \end{aligned} \quad (7)$$

The differential input signals Vie are obtained by using the formulae (1), (2), and (7), as follows:

$$\begin{aligned} Vie &= \Delta Vbe1 - \Delta Vbe2 + Voe \\ &= VT \cdot \ln(I1 + I2 + \Delta I) - VT \cdot \ln(I1 + I2 - \Delta I) + VT \cdot \ln(I2 + \Delta I) + \\ &\quad (I2 + \Delta I) * R1 - VT \cdot \ln(I2 - \Delta I) - (I2 - \Delta I) * R2 \end{aligned} \quad (8)$$

Thus, from the equations (7) and (8), the gain Gve of the first emitter follower 5 with the load circuit 11 is given in a formula as follows:

$$\begin{aligned} Gve &= Voe/Vie \\ &= [VT \cdot \ln(I2 + \Delta I) + (I2 + \Delta I) * R1 - VT \cdot \ln(I2 - \Delta I) - (I2 - \Delta I) * \\ &\quad R2]/[VT \cdot \ln(I1 + I2 + \Delta I) - VT \cdot \ln(I1 + I2 - \Delta I) + VT \cdot \\ &\quad \ln(I2 + \Delta I) + (I2 + \Delta I) * R1 - VT \cdot \ln(I2 - \Delta I) - (I2 - \Delta I) * R2] \end{aligned} \quad (9)$$

Substituting R1=R2=(a×VT)/I2 for the corresponding terms in the formula (9) gives a formula as follows:

$$\begin{aligned} Gve &= [VT \cdot \ln(I2 + \Delta I) + ((I2 + \Delta I) * a * VT)/I2 - VT \cdot \ln(I2 - \Delta I) - \\ &\quad ((I2 - \Delta I) * a * VT)/I2]/[VT \cdot \ln(I1 + I2 + \Delta I) - VT \cdot \ln(I1 + \\ &\quad I2 - \Delta I) + VT \cdot \ln(I2 + \Delta I) + ((I2 + \Delta I) * a * VT)/I2 - \\ &\quad VT \cdot \ln(I2 - \Delta I) - ((I2 - \Delta I) * a * VT)/I2] \\ &= [\ln(I2 + \Delta I) - \ln(I2 - \Delta I) + (2 * a * \Delta I)/I2]/[\ln(I1 + I2 + \Delta I) - \\ &\quad \ln(I1 + I2 - \Delta I) + \ln(I2 + \Delta I) - \ln(I2 - \Delta I) + (2 * a * \Delta I)/I2] \end{aligned} \quad (10)$$

The differential input signals Vie is obtained by substituting R1=R2=a×VT/I2 for the corresponding terms in the formula (8):

$$\begin{aligned} Vie &= VT \cdot \ln(I1 + I2 + \Delta I) - VT \cdot \ln(I1 + I2 - \Delta I) + \\ &\quad VT \cdot \ln(I2 + \Delta I) + ((I2 + \Delta I) * a * VT)/I2 - \\ &\quad VT \cdot \ln(I2 - \Delta I) - ((I2 - \Delta I) * a * VT)/I2 \\ &= [\ln(I1 + I2 + \Delta I) - \ln(I1 + I2 - \Delta I) + \ln(I2 + \Delta I) - \\ &\quad \ln(I2 - \Delta I) + (2 * a * \Delta I)/I2] * VT \end{aligned} \quad (11)$$

With reference to FIG. 3, contemplated is a mathematical calculation of obtaining a gain Gva of the differential amplifying circuit 15.

Differential input signals applied to the bases of the differential transistors Q5 and Q6 in a pair are denoted by Via, differential output signals produced from the collectors of those transistors are denoted by Voa, and current flowing in the current source 17 is represented by 2×I3. A coefficient of current amplification β of the transistors is infinite.

If the currents I3 flowing in the differential transistors Q5 and Q6 are respectively varied by ΔI due to the differential input signals Via, voltages ΔVbe5 and ΔVbe6 developed between the bases and emitters of the transistors Q5 and Q6, and voltages ΔVr3, ΔVr4, ΔVr5, and ΔVr6 developed at the resistances R3, R4, R5 and R6 (having resistance values R3 to R6) are given in the following equations:

$$\Delta Vbe5 = VT*ln(I3+\Delta I) \quad (12)$$

$$\Delta Vbe6 = VT*ln(I3-\Delta I) \quad (13)$$

$$\Delta Vr3 = (I3+\Delta I)*R3 \quad (14)$$

$$\Delta Vr4 = (I3-\Delta I)*R4 \quad (15)$$

$$\Delta Vr5 = (I3+\Delta I)*R5 \quad (16)$$

$$\Delta Vr6 = (I3-\Delta I)*R6 \quad (17)$$

The differential input signals Via are obtained by using the formulae (12), (13), (14), and (15), as follows:

$$Via = \Delta Vbe5 + \Delta Vr3 - (\Delta Vbe6 + \Delta Vr4) \quad (18)$$
$$= VT \cdot \ln(I3+\Delta I) + (I3+\Delta I)*R3 -$$
$$VT \cdot \ln(I3-\Delta I) - (I3-\Delta I)*R4$$

The differential output signals Voa are expressed by using the formulae (16) and (17), as follows:

$$Voa = \Delta Vr5 - \Delta Vr6 \quad (19)$$
$$= (I3+\Delta I)*R5 - (I3-\Delta I)*R6$$

Thus, from the equations (18) and (19), the gain Gva of the differential amplifying circuit 15 can be expressed in the following formula:

$$Gva = Voa/Via \quad (20)$$
$$= [(I3+\Delta I)*R5 - (I3-\Delta I)*R6] / [VT \cdot \ln(I3+\Delta I) +$$
$$(I3+\Delta I)*R3 - VT \cdot \ln(I3-\Delta I) - (I3-\Delta I)*R4]$$

Substituting R3=R4=R5=R6=(b×VT)/I3 for the corresponding terms in the formula (20) gives the gain Gva as follows:

$$Gva = [((I3+\Delta I)*b*VT)/I3 - ((I3-\Delta I)*b*VT)/I3] / \quad (21)$$
$$[VT \cdot \ln(I3+\Delta I) + ((I3+\Delta I)*b*VT)/I3 -$$
$$VT \cdot \ln(I3-\Delta I) - ((I3-\Delta I)*b*VT)/I3]$$
$$= [(2*\Delta I*b)/I3] / [\ln(I3+\Delta I) - \ln(I3-\Delta I) + (2*\Delta I*b)/I3]$$

The differential input signals Via are obtained by substituting R3=R4=(b×VT)/I3 for the corresponding terms in the equation (18), as follows:

$$Via = VT \cdot \ln(I3+\Delta I) + ((I3+\Delta I)*b*VT)/I3 - \quad (22)$$
$$VT \cdot \ln(I3-\Delta I) - ((I3-\Delta I)*b*VT)/I3$$
$$= [\ln(I3+\Delta I) - \ln(I3-\Delta I) + (2*b*\Delta I)/I3]*VT$$

When the terms I1, I2, I3, a, and b in the equations (10), (11), (21), and (22) are respectively substituted with 4, 1, 1, 1, and 4, the gain Gve of the first emitter follower 5 with the load circuit 11, the differential input signals Vie of the same, the gain Gva of the differential amplifying circuit 15, and the differential input signals Via of the same are expressed in the following formulae, respectively:

$$Gve = [\ln(1+\Delta I) - \ln(1-\Delta I) + 2*\Delta I] / \quad (23)$$
$$[\ln(5+\Delta I) - \ln(5-\Delta I) + \ln(1+\Delta I) - \ln(1-\Delta I) + 2*\Delta I]$$

$$Vie = [\ln(5+\Delta I) - \ln(5-\Delta I) + \ln(1+\Delta I) - \ln(1-\Delta I) + 2*\Delta I]*VT \quad (24)$$

$$Gva = [8*\Delta I] / [\ln(1+\Delta I) - \ln(1-\Delta I) + 8*\Delta I] \quad (25)$$

$$Via = [\ln(1+\Delta I) - \ln(1-\Delta I) + 8*\Delta I]*VT \quad (26)$$

Then, the gains, which are attained corresponding to the input signals of zero, will be normalized by 1 for the formulae (23) and (25). In other words, with the differential input signals applied at zero, the gain of the first emitter follower 5 with the load circuit 11 and the gain of the differential amplifying circuit 15 are at the same initial level.

In order to obtain a gain Gve0 for the differential input signals of zero, the Gve in the formula (23) is reconsidered as follows:

$$Gve = [\ln(1+\Delta I) - \ln(1-\Delta I) + 2*\Delta I] / [\ln 5 + \ln(1+\Delta I/5) -$$
$$\ln 5 - \ln(1-\Delta I/5) + \ln(1+\Delta I) - \ln(1-\Delta I) + 2*\Delta I]$$

where ΔI is infinitesimal. When the differential input signals are at zero, the gain Gve0 of the first emitter follower 5 with the load circuit 11 is given as follows:

$$Gve0 = [\Delta I + \Delta I + 2*\Delta I] / [\Delta I/5 + \Delta I/5 + \Delta I + \Delta I + 2*\Delta I]$$
$$= [4*\Delta I] / [(2*\Delta I)/5 + 4*\Delta I]$$
$$= 20/22$$

Similarly, having the infinitesimal ΔI in the formula (25), a gain Gva0 of the differential amplifying circuit 15 for the differential input signals of zero is expressed as follows:

$$Gva0 = [8*\Delta I] / [\Delta I + \Delta I + 8*\Delta I] = 4/5$$

Thus, after normalization by 1, gains for the differential input signals of zero, namely, a gain Gven of the first emitter follower 5 with the load circuit 11 and a gain Gvan of the differential amplifying circuit 15 are expressed by using Gven=Gve/Gve0 and Gvan=Gva/Gva0, respectively, as follows:

$$Gven = [22/20] * [\ln(1+\Delta I) - \ln(1-\Delta I) + 2*\Delta I] / \quad (27)$$
$$[\ln(5+\Delta I) - \ln(5-\Delta I) + \ln(1+\Delta I) - \ln(1-\Delta I) + 2*\Delta I]$$

$$Gvan = [(5/4)*(8*\Delta I)] / [\ln(1+\Delta I) - \ln(1-\Delta I) + 8*\Delta I] \quad (28)$$

Figure 4:
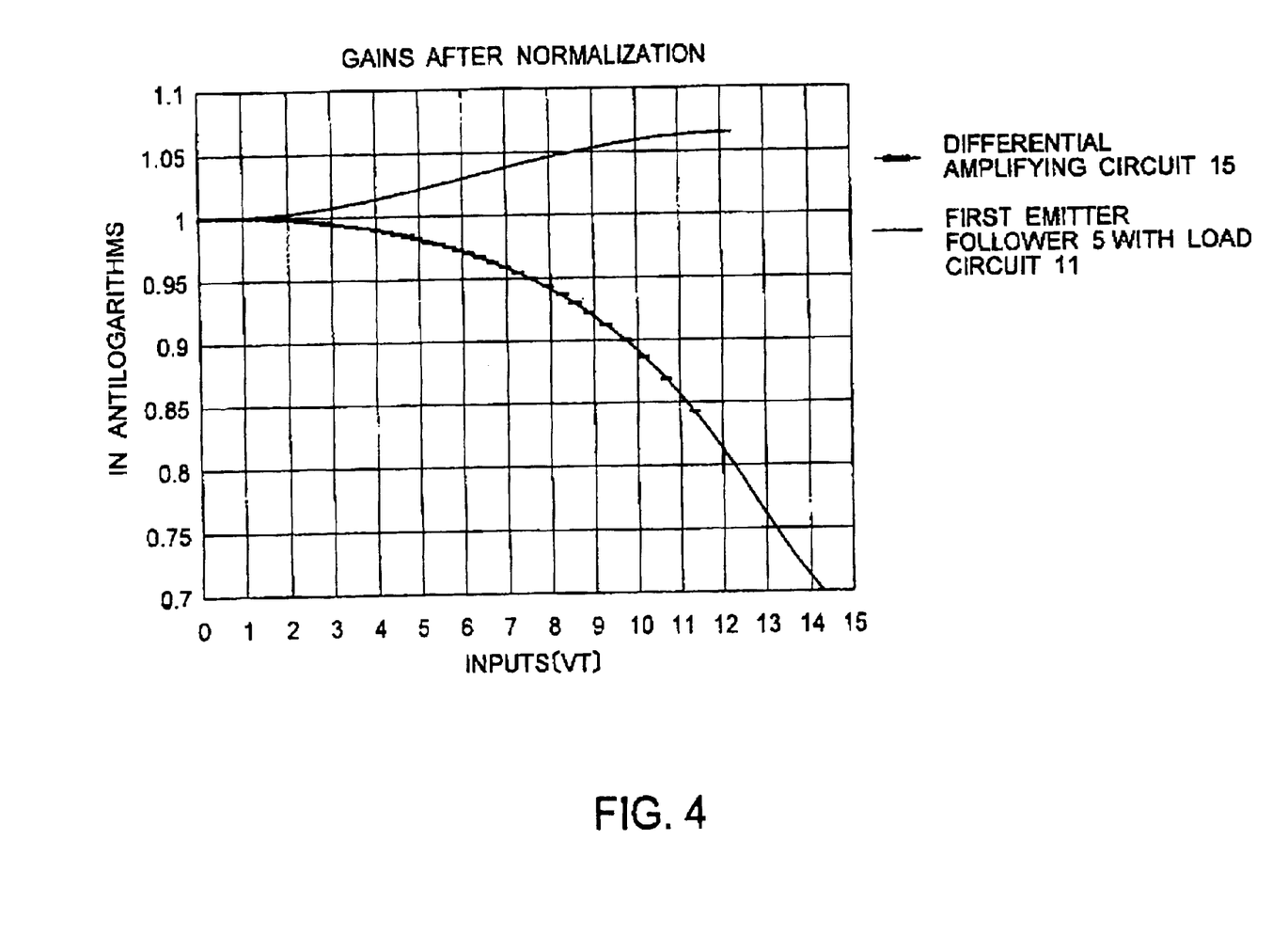
FIG. 4 is a graph showing gain variations on the first emitter follower (5) with the load circuit (11) shown in FIG. 2 and on the differential amplifying circuit (15) in FIG. 3.

A graph with the varied ΔI for the formulae (24), (26), (27) and (28) are shown in FIG. 4. The horizontal axis of the graph represents the differential input signals Vie and Via, which are obtained by calculations on the equations (24) and (26), respectively. The vertical axis represents the gains (in antilogarithms).

As will be recognized in FIG. 4, the first emitter follower 5 with the load circuit 11 and the differential amplifying circuit 15 have their respective gains mutually inversed in characteristics. The differential amplifier would have the total gain of which characteristics are represented by a product of the gain of the first emitter follower 5 with the load circuit 11 multiplied by the gain of the differential amplifying circuit 15. Thus, the total gain of the differential amplifier is fixed throughout a wide input range. This means that the differential amplifier, as a whole, attains improved distortion.

In addition to that, when a value expressed in R3×I3=R4×I3 is small, R1 and R2 may sometimes be omitted.

Figure 5:
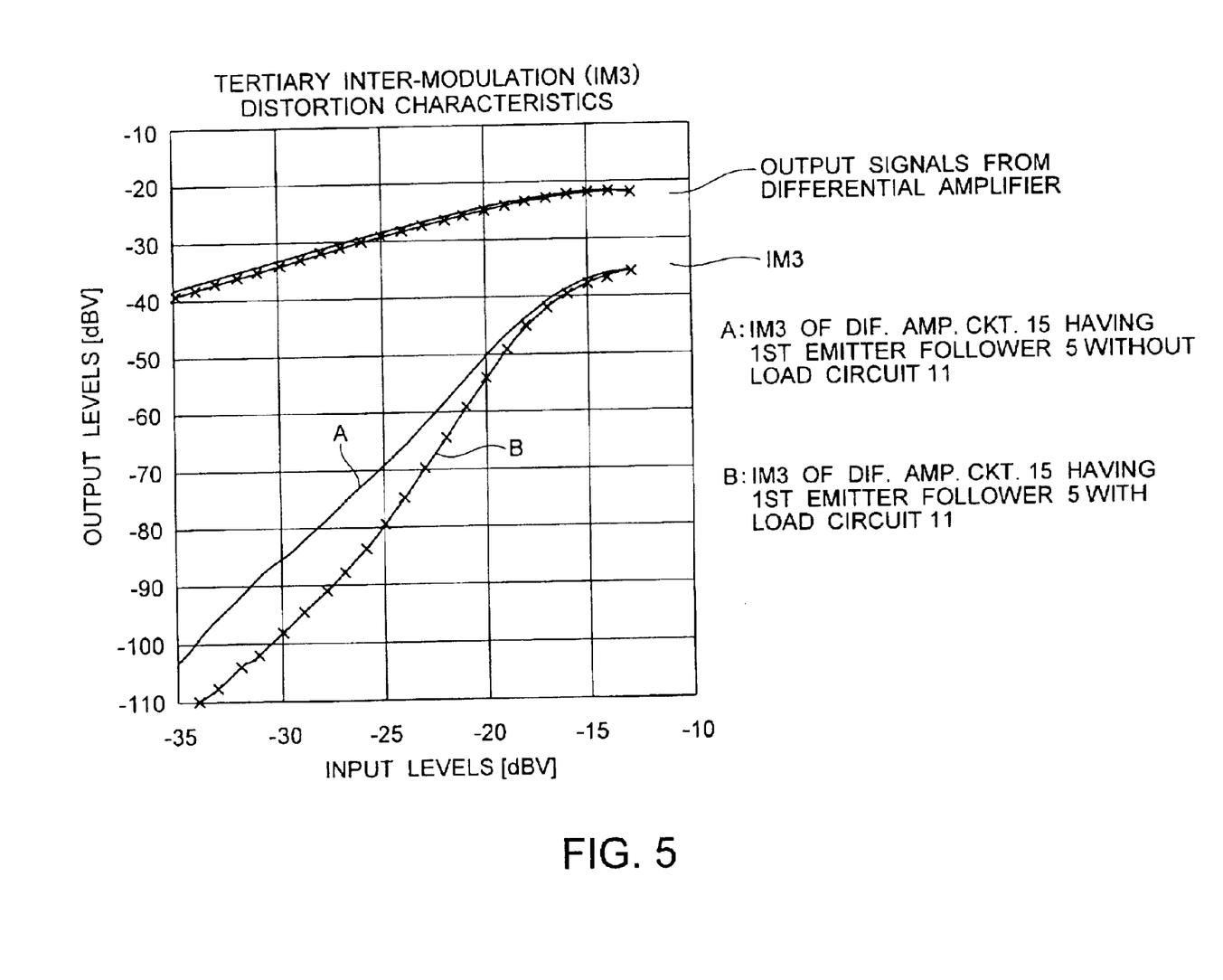
FIG. 5 is a graph showing IM3 (third order intermodulation) distortion characteristics respectively for the differential amplifier including the first emitter follower (5) without and with the load circuit (11), respectively.

FIG. 5 depicts simulation results for characteristics of third order inter-modulation (IM3) distortion. Simulation conditions are given as I1=80 µA, I3=160 µA, I2=20 µA, R1=R2=1.5 k Ω, R3=R4=1 k Ω, and R5=R6=1 k Ω. In the above mathematical equations, requirements a=1 and b=4 are incorporated, but, in fact, the values of a and b are slightly varied from those applied to the equations so as to take values of a and b that would lead to the least distortion.

Depicted in FIG. 5 are curves A and B representing the third order inter-modulation (IM3) distortion of the differential amplifying circuit 15 of varied circuit configurations between the first emitter follower 5 with and without the load circuit 11. It is apparent that the first emitter follower 5 with the load circuit 11 could greatly improve the IM3 distortion of the differential amplifying circuit 15.

If it is desired that the third order intercept points (OIP3 located at the output terminals 19 and 21) of the differential amplifying circuit 15 is enhanced by 6 dB under the condition of the same level of current supplied to both the first emitter follower 5 and the differential amplifying circuit 15, similar to the simulation conditions given in FIG. 5, the configuration according to the present invention successfully supplies the load circuit 11 with only one quarter of the current that is applied to the first emitter follower 5, which leads to an increase in the entire current flowing throughout the differential amplifier as small as +12.5% as obtained by (2×I1+I3+2×I2)/(2×I1+I3)=1.125.

In the prior art circuit technologies as shown in FIG. 10, however, since the current applied to the differential amplifying circuit 15 must be doubled to attain the same effect, the resulting total current flowing throughout the differential amplifier is increased as great as +50% as obtained by (2×I1+2×I3)/(2×I1+I3)=1.5.

As is obvious from the above, the present invention improves the distortion with reduced rate of increase in consumed current, compared with the prior art.

Alternative to the NPN transistors Q1 to Q6, PNP transistors may be used. In this case, relations of power supplies to power supplied terminals should be inverted.

<Embodiment 2>

The first embodiment is a case under the assumption that the differential amplifying circuit 15 would not be a load to the first emitter follower 5. In some differential amplifiers such as that is used for handling high frequency or used for a transmitted signal generating stage where current consumed in the differential amplifying circuit 15 is relatively large, input impedance at the differential amplifying circuit 15 is reduced. Resultantly, the differential amplifying circuit 15 turns out to be a load to the first emitter follower 5, and this contradicts the assumption given for the first embodiment.

A coefficient of current amplification of the transistors, emitter resistances of the differential transistors Q5 and Q6 in pairs, and resistances connected to the emitters of the differential transistors Q5 and Q6 are herein given as β, re, and RE, respectively.

With these given terms, an absolute value of the input impedance of the differential amplifying circuit 15 is approximated in the following equation as $|Zin|=2\beta \times (re+RE)$ where β is approximated in the following equation as $\beta=[(\beta o \times ft)/f]/[\beta o+ft/f]$ where βo is a coefficient of current amplification at low frequency and usually takes an approximate value as high as 100, ft is a transition frequency, and f is a frequency of the differential input signals to the differential amplifying circuit 15.

Giving emitter currents I of the transistors Q5 and Q6 in a differential pair and voltage drop c×VT developed across the resistance RE, equations re=VT/I and RE=(c×VT)/I are used to for substitutions for the corresponding terms in the above formula as in $|Zin|=2 \times \beta \times [VT/I+(c \times VT)/I]$.

From this formula, it is apparent that |Zin| is in proportion to β but in inverse proportion to I.

Also, from the equation $\beta=[(\beta o \times ft)/f]/[\beta o+ft/f]$, it is apparent that β decreases at high frequency.

For instance, if the frequency f is one tenth of the value of ft, β is reduced to a level as low as 10.

As has been recognized, it is obvious that a reduction of β at high frequency and an increase in current at the differential amplifying circuit 15 lead to the reduced absolute value |Zin| of the input impedance of the differential amplifying circuit 15. This means the differential amplifying circuit 15 turns out to be a load to the first emitter follower 5, and hence, there is a need for improvement in some way.

Figure 6:
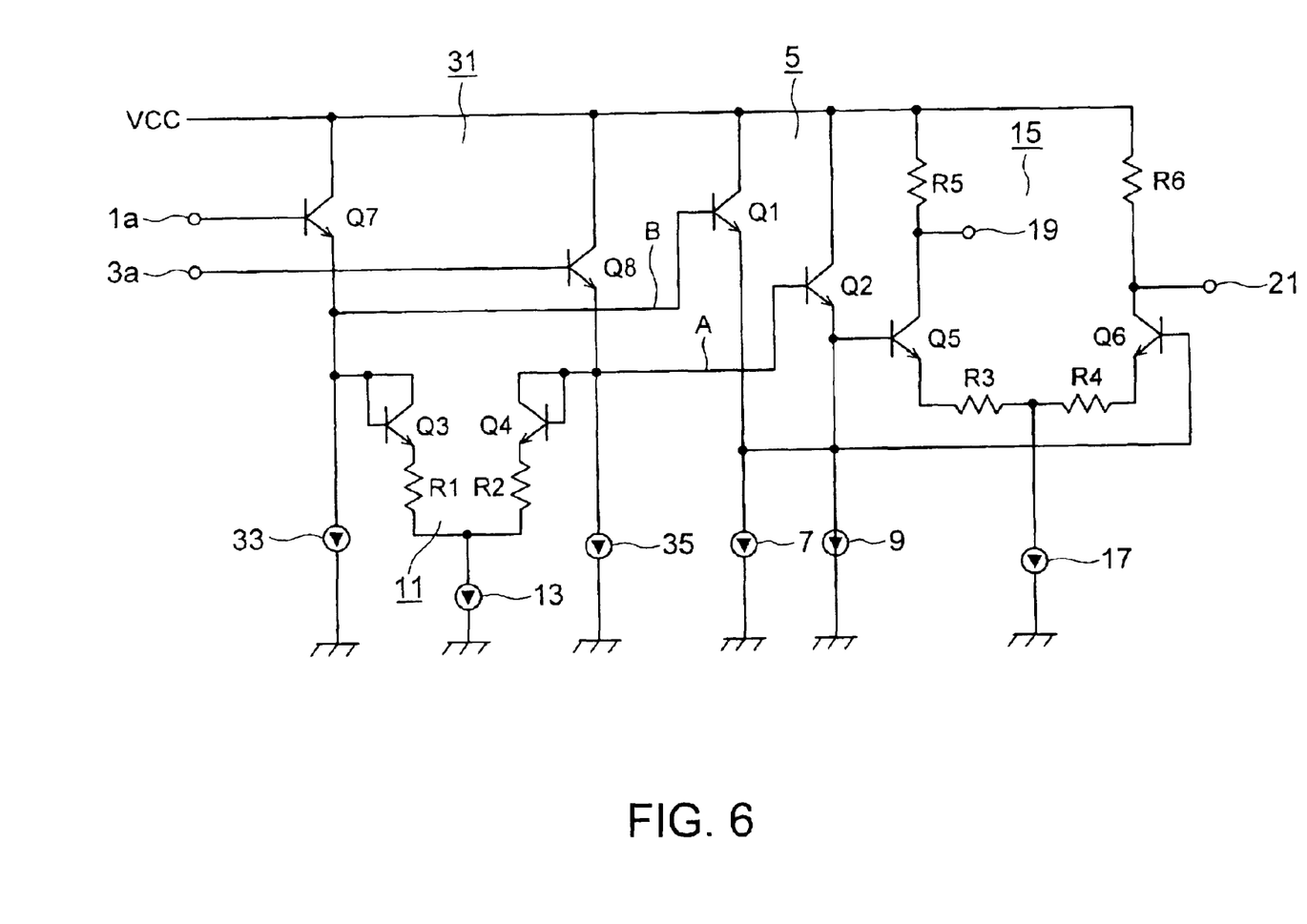
FIG. 6 is a diagram illustrating a theory of a second embodiment of the differential amplifier according to the present invention in case of a reduced absolute value of input impedance in the differential amplifying circuit (15)

Then, depicted in FIG. 6 is a theoretical module of a second embodiment of the differential amplifier according to the present invention that is designed to cope with the reduced absolute value of the input impedance of the differential amplifying circuit 15.

When there arises a problem that the differential amplifying circuit 15 is a load to the first emitter follower 5, a second emitter follower 31 may be added in a preceding stage to the first emitter follower 5, as can be seen in FIG. 6.

The second emitter follower 31 consists of NPN transistors Q7 and Q8, and current sources 33 and 35. The transistor Q7 has its collector connected to voltage supply VCC, its base connected to an input terminal 1a, and its emitter connected to one end of the current source 33. The other end of the current source 33 is grounded.

The transistor Q8 has its collector connected to the voltage supply VCC, its base connected to an input terminal 3a, and its emitter connected to one end of the current source 35. The other end of the current source 35 is grounded.

Unlike the first embodiment, the load circuit 11 is connected to the second emitter follower 31.

A transistor Q3 has its collector and base connected to the emitter of the transistor Q7 in common, and its emitter connected to one end of a resistance R1. The other end of the resistance R1 is connected to one end or first end of a current source 13, and the other or second end of the current source 13 is grounded. A transistor Q4 has its collector and base connected to the emitter of the transistor Q8 in common, and its emitter connected to one end of a resistance R2. The other end of the resistance R2 is connected to the first end of the current source 13.

In this situation, an absolute value |Zin| of input impedance of a first emitter follower 5 in a previous stage to a differential amplifying circuit 15 (i.e., input impedance recognized from stand points A and B in FIG. 6) is approximated in an expression $|Zin|=2 \times \beta \times \beta \times (re+RE)$, and hence, even with a reduced β due to high frequency, the differential amplifying circuit 15 does not turn out to be a load to the second emitter follower 31 in the earlier stage, and this meets the assumption for the first embodiment.

Another example, which is varied from that in FIG. 6, where the load circuit 11 is connected to the first emitter follower 5 will be discussed with reference to FIG. 7.

Figure 7:
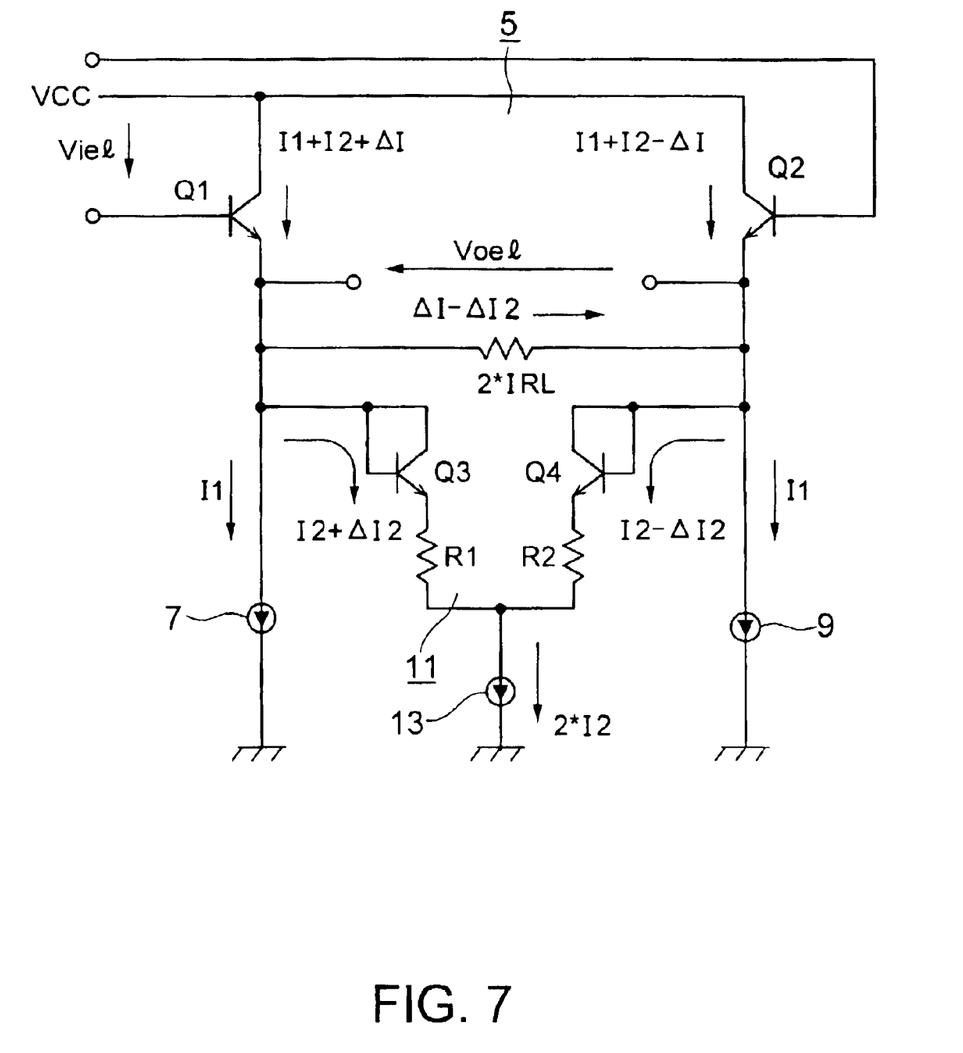
FIG. 7 is a circuit diagram of the first emitter follower (5) with an equivalent resistance of the differential amplifying circuit (15) and with the load circuit (11) instead of the configuration shown in FIG. 6.

FIG. 7 is a circuit diagram that illustrates a resistance 2×RL connected to the first emitter follower 5 with the load circuit 11. The resistance 2×RL is equivalent to |Zin| or the absolute value of the input impedance at the differential amplifying circuit 15. From FIG. 7, a gain Gve1 of the first emitter follower 5 with the load circuit 11 will be obtained with the resistance RL being varied.

Differential input signals applied to bases of the transistors Q1 and Q2 are denoted by Vie1, differential output signals produced from emitters of the transistors Q1 and Q2 are represented by Voe1, currents flowing in the current sources 7 and 9 are denoted by I1, and current flowing in the current source 13 is designated by 2×I2, respectively.

It is now assumed that, because of the differential input signals Vie1, currents flowing in the transistors Q1 and Q2 are varied by ΔI, and currents flowing in the transistors Q3 and Q4 are varied by ΔI2. In such a situation, following equations can be used to express voltages ΔVbe1, ΔVbe2, ΔVbe3, and ΔVbe4 developed between the bases and emitters of the transistors Q1, Q2, Q3, and Q4, and voltages ΔVr1 and ΔVr2 developed across the resistances R1 and R2 (having resistance values R1 and R2), respectively:

$$\Delta Vbe1 = VT \times ln(I1+I2+\Delta I) \quad (29)$$

$$\Delta Vbe2 = VT \cdot ln(I1+I2-\Delta I) \quad (30)$$

$$\Delta Vbe3 = VT \cdot ln(I2+\Delta I2) \quad (31)$$

$$\Delta Vbe4 = VT \cdot ln(I2-\Delta I2) \quad (32)$$

$$\Delta Vr1 = (I2+\Delta I2)^* R1 \quad (33)$$

$$\Delta Vr2 = (I2-\Delta I2)^* R2 \quad (34)$$

$$\Delta Vr1 = (\Delta I - I2)^* 2^* RL \quad (35)$$

The differential output signals Voe1 are obtained by using the equations (31), (32), (33) and (34), as follows:

$$Voe1 = \Delta Vbe3 + \Delta Vr1 - (\Delta Vbe4 + \Delta Vr2) \quad (36)$$
$$= VT \cdot ln(I2+\Delta I2) + (I2+\Delta I2)*R1 -$$
$$VT \cdot ln(I2-\Delta I2) - (I2-\Delta I2)*R2$$

Since ΔVr1=Voe1 is satisfied, ΔI is obtained by using the equations (35) and (36) as follows:

$$(\Delta I - \Delta I2)*2*RL = VT \cdot ln(I2+\Delta I2) + (I2+\Delta I2)*R1 - \quad (37)$$
$$VT \cdot ln(I2-\Delta I2) - (I2-\Delta I2)*R2$$
$$\Delta I = \Delta I2 + [VT \cdot ln(I2+\Delta I2) + (I2+\Delta I2)*R1 -$$
$$VT \cdot ln(I2-\Delta I2) - (I2-\Delta I2)*R2]/[2*RL]$$

The differential input signals Vie1 are obtained by using the formulae (29), (30), and (36), as follows:

$$Vie1 = \Delta Vbe1 - \Delta Vbe2 + Voe1 \quad (38)$$
$$= VT \cdot ln(I1+I2+\Delta I) - VT \cdot ln(I1+I2-\Delta I) + VT \cdot ln(I2+$$
$$\Delta I2) + (I2+\Delta I2)*R1 - VT \cdot ln(I2-\Delta I2) - (I2-\Delta I2)*R2$$

Thus, from the equations (36) and (38), the gain Gve1 of the first emitter follower 5 with the load circuit 11 is given in a formula as follows:

$$Gve1 = Voe1/Vie1 \quad (39)$$
$$= [VT \cdot ln(I2+\Delta I2) + (I2+\Delta I2)*R1 - VT \cdot ln(I2-\Delta I2) -$$
$$(I2-\Delta I2)*R2]/[VT \cdot ln(I1+I2+\Delta I) -$$
$$VT \cdot ln(I1+I2-\Delta I) + VT \cdot ln(I2+\Delta I2) +$$
$$(I2+\Delta I2)*R1 - VT \cdot ln(I2-\Delta I2) - (I2-\Delta I2)*R2]$$

Substituting R1=R2=(a×VT)/I2 for the corresponding terms in the formula (39) gives a formula as follows:

$$Gvel = [VT \cdot ln(I2+\Delta I2) + ((I2+\Delta I2)*a*VT)/I2 - \quad (40)$$
$$VT \cdot ln(I2-\Delta I2) - ((I2-\Delta I2)*a*VT)/I2]/$$
$$[VT \cdot ln(I1+I2+\Delta I) - VT \cdot ln(I1+I2-\Delta I) +$$
$$VT \cdot ln(I2+\Delta I2) + ((I2+\Delta I2)*a*VT)/I2 -$$
$$VT \cdot ln(I2-\Delta I2) - ((I2-\Delta I2)*a*VT)/I2]$$
$$= [ln(I2+\Delta I2) - ln(I2-\Delta I2) + (2*a*\Delta I2)/I2]/$$
$$[ln(I1+I2+\Delta I) - ln(I1+I2-\Delta I) + ln(I2+\Delta I2) -$$
$$ln(I2-\Delta I2) + (2*a*\Delta I2)/I2]$$

ΔI is obtained by substituting R1=R2=R=(a×VT)/I2 and RL=b×R=(b×a×VT)/I2 for the corresponding terms in the formula (37):

$$\Delta I = \Delta I2 + [VT \cdot ln(I2+\Delta I2) + ((I2+\Delta I2)*a*VT)/I2 - \quad (41)$$
$$VT \cdot ln(I2-\Delta I2) - ((I2-\Delta I2)*a*VT)/I2]/$$
$$[(2*b*a*VT)/I2]$$
$$= \Delta I2 + I2*[ln(I2+\Delta I2) - ln(I2-\Delta I2) + (2*a*\Delta I2)/I2]/$$
$$[2*a*b]$$

The differential input signals Vie1 are obtained by substituting R1=R2=a×VT/I2 for the corresponding terms in the formula (38):

$$Vie1 = VT \cdot ln(I1+I2+\Delta I) - VT \cdot ln(I1+I2-\Delta I) + \quad (42)$$
$$VT \cdot ln(I2+\Delta I2) + ((I2+\Delta I2)*a*VT)/I2 -$$
$$VT \cdot ln(I2-\Delta I2) - ((I2-\Delta I2)*a*VT)/I2$$
$$= [ln(I1+I2+\Delta I) - ln(I1+I2-\Delta I) +$$
$$ln(I2+\Delta I2) - ln(I2-\Delta I2) + (2*a*\Delta I2)/I2]*VT$$

If 4, 1, 1, and 1 are substituted for I1, I3, I2, and a in the formulae (40), (41), and (42), respectively, expressed in the following equations are the gain Gve1 of the first emitter follower 5 including the load circuit 11 and the absolute value of the input impedance of the differential amplifying circuit 15, the differential input signals Vie1 of the same, and ΔI:

$$Gvel = [ln(1+\Delta I2) - ln(1-\Delta I2) + 2*\Delta I2]/ \quad (43)$$
$$[ln(5+\Delta I) - ln(5-\Delta I) + ln(1+\Delta I2) - ln(1-\Delta I2) + 2*\Delta I2]$$

$$Viel = \quad (44)$$
$$[ln(5+\Delta I) - ln(5-\Delta I) + ln(1+\Delta I2) - ln(1-\Delta I2) + 2*\Delta I2]*VT$$

$$\Delta I = \Delta I2 + [ln(1+\Delta I2) - ln(1-\Delta I2) + 2*\Delta I2]/[2*b] \quad (45)$$

Then, the gains, which are attained corresponding to the input signals of zero, will be normalized by 1 for the formula (43). In other words, with the differential input signals applied at zero, the gain of the first emitter follower 5 including the load circuit 11 and the equivalent component to the absolute value of the input impedance of the differential amplifying circuit 15 and the gain of the differential amplifying circuit 15 are at the same initial level.

Having an infinitesimal $\Delta I2$ in the formula (45), $\Delta I$ can be expressed in an equation as follows:

$$\Delta I = \Delta I2 + [\Delta I2 + \Delta I2 + 2*\Delta I2]/[2*b]$$
$$= (4/2b+1)*\Delta I2$$

The above equation on Gve1 is transformed as in the following manner so as to obtain a gain Gve1 of the first emitter follower 5 including both the load circuit 11 and the equivalent component to the absolute value of the input impedance of the differential amplifying circuit 15 with the differential input signals applied at zero level:

$$Gvel = [\ln(1+\Delta I2) - \ln(1-\Delta I2) + 2*\Delta I2]/[\ln 5 + \ln(1+\Delta I/5) - \ln 5 - \ln(1-\Delta I/5) + \ln(1+\Delta I2) - \ln(1-\Delta I2) + 2*\Delta I2]$$

Having the infinitesimal $\Delta I2$ and incorporating $\Delta I=(4/2b+1)\times\Delta I2$, obtained below is the gain Gve1 of the first emitter follower 5 including the load circuit 11 and an equivalent component to the input impedance of the differential amplifier when the differential input signals are of zero:

$$Gvel0 = [\Delta I2 + \Delta I2 + 2*\Delta I2]/[\Delta I/5 + \Delta I/5 + \Delta I2 + \Delta I2 + 2*\Delta I2]$$
$$= [\Delta I2 + \Delta I2 + 2*\Delta I2]/[((4/2b+1)*\Delta I2)/5 + ((4/2b+1)*\Delta I2)/5 + \Delta I2 + \Delta I2 + 2*\Delta I2]$$
$$= 20/(4/b+22)$$

Thus, after normalization by 1, a gain for the differential input signals of zero, namely, a gain Gve1n of the first emitter follower 5 including both the load circuit 11 and the equivalent component to the absolute value of the input impedance of the differential amplifying circuit 15 is expressed by using Gve1n=Gve1/Gve10, as follows:

$$Gveln = [(4/b+22)/20]*[\ln(1+\Delta I2) - \ln(1-\Delta I2) + 2*\Delta I2]/ \quad (46)$$
$$[\ln(5+\Delta I) - \ln(5-\Delta I) + \ln(1+\Delta I2) - \ln(1-\Delta I2) + 2*\Delta I2]$$

Figure 8:
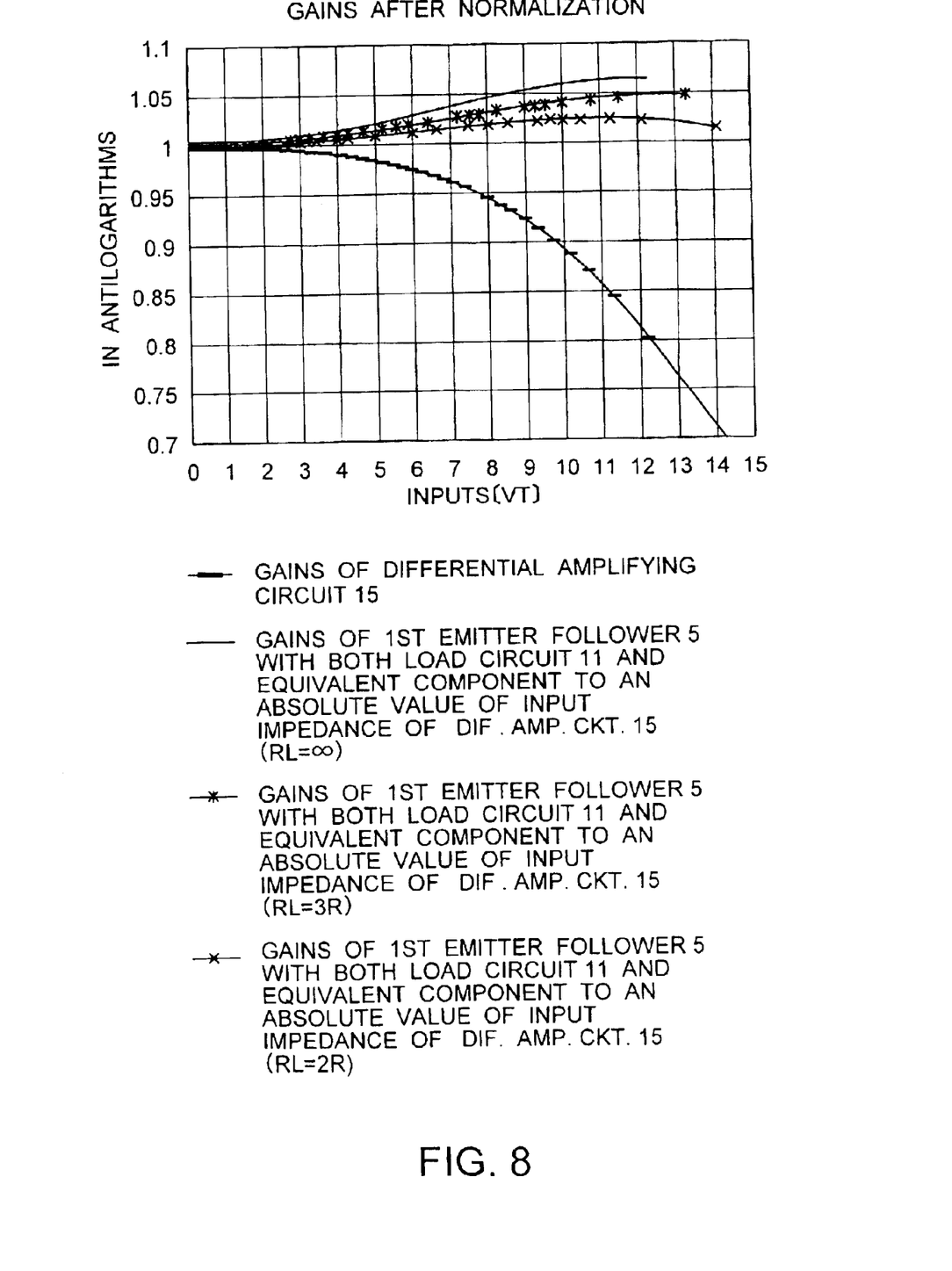
FIG. 8 is a graph showing gain variations on the emitter follower (5) in FIG. 7 that includes the load circuit (11) and an equivalent component to an absolute value of input impedance of the differential amplifying circuit (15)

Substituting 2 and 3 for the term b and varying $\Delta I2$ in the formulae (44), (45) and (46), the results are plotted in a graph of FIG. 8 where the horizontal axis represents the differential input signals Vie1 while the vertical axis represents the gains (in antilogarithms), and characteristics of the formulae (44), (45), and (46) are superimposed on the graph in FIG. 4.

As will be recognized in FIG. 8, unless the resistance RL is sufficiently larger than the resistance R, inverse characteristics of the gain of the differential amplifying circuit 15 to that of the first emitter follower 5 are lost when the latter includes both the load circuit 11 and the equivalent component to the absolute value of the input impedance of the differential amplifying circuit 15.

This means that the load circuit 11 is not capable of compensating the characteristic distortion of the differential amplifying circuit 15. As a consequence, the effect of distortion improvement in the differential amplifier, as a whole, is scaled down.

Thus, when the differential amplifying circuit 15 has a low input impedance and turns out to be a load to the first emitter follower 5, it is undesirable providing the load circuit 11 in the first emitter follower 5 located in the preceding step to the differential amplifying circuit 15.

Instead, as shown in FIG. 6, the load circuit 11 may be connected to an output terminal of the second emitter follower 31 with lighter load so as to compensate for the total distortion in the differential amplifier.

If differential amplifiers are connected in multi-stage, emitter followers should be incorporated at input and output of the differential amplifier, and then there is no need of applying an additional emitter follower.

Alternative to the transistors Q1 to Q8, PNP transistors may be used. In this case, relations of power supplies to power supplied terminals should be inverted.

Figure 9:
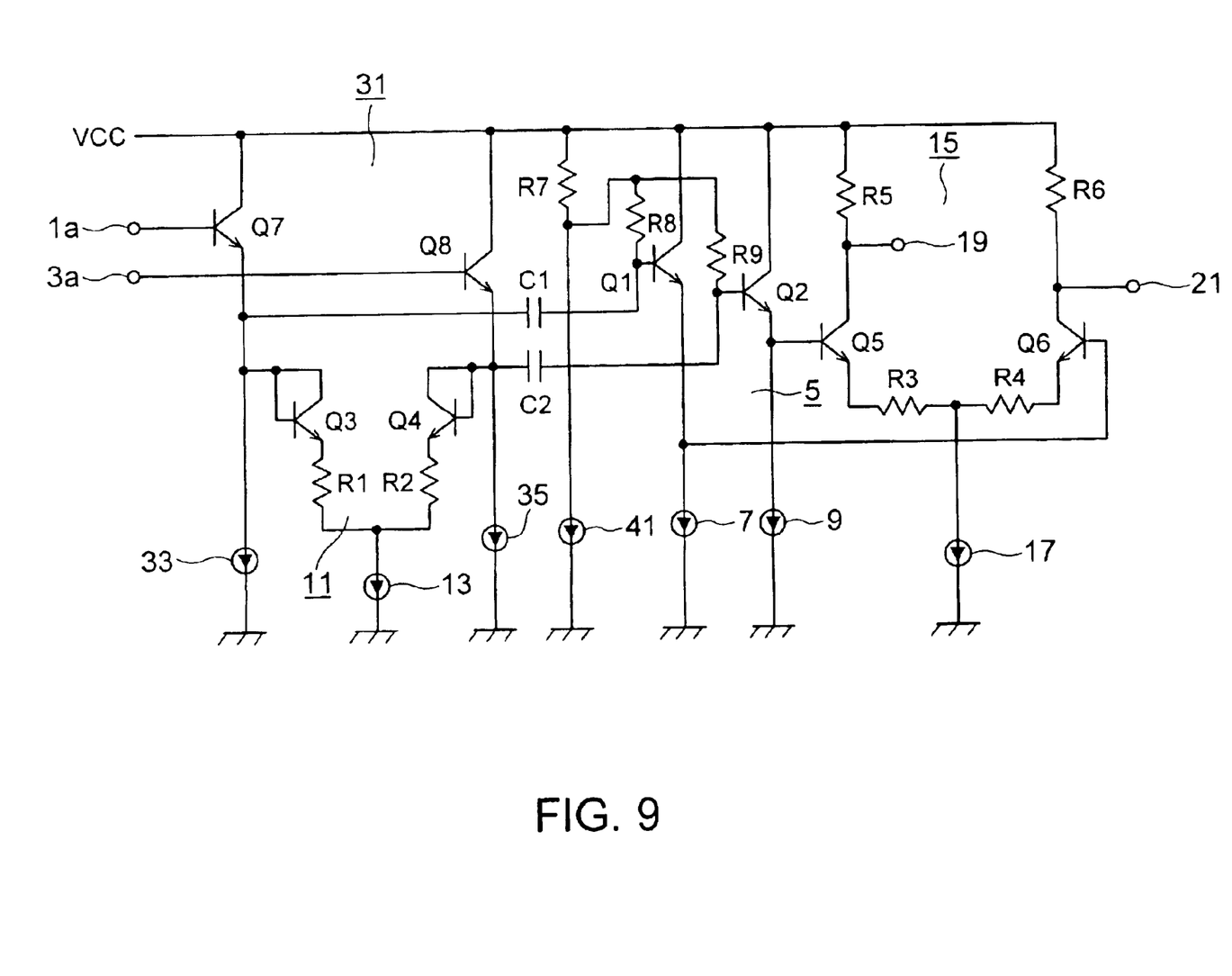
FIG. 9 is a circuit diagram showing multi-stage connected differential amplifiers.

FIG. 9 provides a circuit diagram showing multi-stage-connected differential amplifier. This is varied from that which is depicted in FIG. 6 in that the differential amplifier includes additional components of capacitors C1 and C2, resistances R7, R8 and R9, and a current source 41.

The capacitor C1 is positioned between the emitter of the transistor Q7 and the base of the transistor Q1. The capacitor C2 is positioned between the emitter of the transistor Q8 and the base of the transistor Q2.

The resistance R7 has its one end or first end connected to the voltage supply VCC and the other or second end connected to one end of the current source 41. The other end of the current source 41 is grounded. The resistance R8 is positioned between the second end of the resistance R7 and the base of the transistor Q1. The resistance R9 is positioned between the second end of the resistance R7 and the base of the transistor Q2.

The resistances R7 and R8 and the current source 41 serve to supply the transistor Q1 with base current. The resistances R7 and R9 and the current source 41 serve to supply the transistor Q2 with base current.

The effect of distortion improvement in the differential amplifier in FIG. 9 is equivalent to that attained in the first embodiment if resistance values across the resistances R8 and R9 are so large that the differential amplifier is no longer a load to the second emitter follower 31 in the earlier stage.

Alternative to the transistors Q1 to Q8, PNP transistors may be used. In this case, relations of power supplies to power supplied terminals should be inverted.

Now assume that the differential amplifiers are multi-stage-connected, for example, the connection of the first emitter follower 5 in connected in series with the second emitter follower 31 as shown in FIG. 6. In this case, since a differential amplifier in down-stream might not operate if the direct current offset from a differential amplifier in up-stream would not be sufficiently amplified, such a connection requires three voltage supplies of Vbe, namely for the first and second emitter followers 5 and 31 and the differential amplifying circuit 15. Hence, when supply voltage is low, the differential amplifier is liable to fail normal operation, for example.

In order to overcome this disadvantage, the differential amplifier may be incorporated with the capacitors C1 and C2 between the first and second emitter followers 5 and 31 as can be seen in FIG. 9 so that the differential amplifier can be activated even with low supply voltage while avoiding influence of the direct current offset from the one in the preceding stage.

As has been described, in accordance with the present invention, an emitter follower and a load circuit are used to develop distortion that characteristically cancels distortion of a differential amplifying circuit, and then, the developed distortion is added to the distortion of the differential amplifying circuit so as to reduce the total distortion of a differential amplifier. Only one quarter of current consumed by the emitter follower is sufficient to the load circuit, and thus, the differential amplifier having improved characteristic distortion can be attained without great increase in the total consumed current of the differential amplifier.

Also, in events of handling high frequency and of handling large current used for a transmitted signal generating stage, a differential amplifier of improved characteristic distortion can be attained if it is provided with emitter followers in tandem configuration in a preceding stage to a differential amplifying circuit and is incorporated with a load circuit in the emitter follower in the earlier stage.

Furthermore, a load circuit used according to the present invention has no active device but passive devices, and hence, a differential amplifier incorporated with such load circuit can attain improved characteristic distortion when it handles high frequency.

What is claimed is:

1. A differential amplifier comprising:
   an emitter follower,
   a differential amplifying circuit connected in a succeeding stage to the emitter follower, and
   a load circuit to compensate distortion of the differential amplifying circuit,
   wherein the load circuit comprises at least one diode.

2. A differential amplifier comprising:
   an emitter follower,
   a differential amplifying circuit connected in a succeeding stage to the emitter follower, and
   a load circuit to compensate distortion of the differential amplifying circuit, wherein the load circuit comprises at least one diode and at least one resistor.

3. A differential amplifier according to claim 1, wherein the at least one diode comprises a transistor having its respective base and collector short-circuited.

4. A differential amplifier according to claim 2, wherein the at least one diode comprises a transistor having its respective base and collector short-circuited.

5. A differential amplifier according to claim 1, wherein the load circuit is connected to an output terminal of the emitter follower.

6. A differential amplifier according to claim 2, wherein the load circuit is connected to an output terminal of the emitter follower.

7. A differential amplifier according to claim 3, wherein the load circuit is connected to an output terminal of the emitter follower.

8. A differential amplifier according to claim 4, wherein the load circuit is connected to an output terminal of the emitter follower.

9. A differential amplifier comprising:
   two emitter followers connected in tandem configuration,
   a differential amplifying circuit connected in a succeeding stage to the emitter followers, and
   a load circuit to compensate distortion of the differential amplifying circuit,
   wherein the emitter follower in the earlier step has its output terminal connected to the load circuit, and at least one capacitor is positioned between the emitter follower in the earlier step and the emitter follower in the succeeding step.

* * * * *